(12) United States Patent
Tokunaga et al.

(10) Patent No.: US 7,962,821 B2
(45) Date of Patent: Jun. 14, 2011

(54) BUILT-IN SELF TESTING CIRCUIT WITH FAULT DIAGNOSTIC CAPABILITY

(75) Inventors: Chikako Tokunaga, Yokohama (JP); Kenichi Anzou, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 226 days.

(21) Appl. No.: 12/199,181

(22) Filed: Aug. 27, 2008

(65) Prior Publication Data
US 2009/0063917 A1    Mar. 5, 2009

(30) Foreign Application Priority Data

Aug. 31, 2007   (JP) ................................ P2007-227000

(51) Int. Cl.
*G01R 31/28* (2006.01)
(52) U.S. Cl. ........................................ 714/733; 714/719
(58) Field of Classification Search .................. 708/524; 714/731, 733, 719, 718
See application file for complete search history.

(56) References Cited

U.S. PATENT DOCUMENTS

| | | | |
|---|---|---|---|
| 5,815,420 A * | 9/1998 | Steiss | 708/524 |
| 7,155,651 B2 * | 12/2006 | Nadeau-Dostie et al. | 714/731 |
| 7,206,984 B2 | 4/2007 | Anzou | |
| 7,213,186 B2 | 5/2007 | Chien | |
| 7,653,854 B2 * | 1/2010 | Anzou et al. | 714/733 |
| 2007/0011535 A1 | 1/2007 | Anzou et al. | |
| 2008/0022176 A1 | 1/2008 | Anzou et al. | |
| 2009/0024885 A1 | 1/2009 | Anzou et al. | |
| 2009/0063917 A1 * | 3/2009 | Tokunaga et al. | 714/719 |

FOREIGN PATENT DOCUMENTS

| | | |
|---|---|---|
| JP | 2005-129174 | 5/2005 |
| JP | 2005285208 | 10/2005 |
| JP | 2008-016156 | 1/2008 |
| JP | 2008016156 | 1/2008 |
| JP | 2009026372 | 2/2009 |

OTHER PUBLICATIONS

Japanese Office Action dated Jan. 5, 2010 corresponding to U.S. Appl. No. 12/199,181, filed Aug. 27, 2008.

* cited by examiner

*Primary Examiner* — David Ton
(74) *Attorney, Agent, or Firm* — Turocy & Watson, LLP

(57) ABSTRACT

A semiconductor integrated circuit includes: a memory collars including: a memory cell; a fetch register that is configured to fetch data as a first fetch data; a comparing unit that is configured to compare the first fetch data with an expected value; a failure detecting signal output unit that is configured to receive the compared result and output a failure detecting signal; and a BIST circuit including: a BIST control unit that is configured to output an instruction and output a BIST status; a shift controller that is configured to receive a first clock signal, the BIST status signal, and the failure detecting signal and output sift enable signal; a shift counter that counts the number of clock pulses on the first clock signal; a first storage register that is configured to receive the first clock signal and the shift enable signal, and a second storage register that is configured to receive a second clock signal.

15 Claims, 5 Drawing Sheets

BUILT-IN SELF TESTING CIRCUIT WITH FAULT DIAGNOSTIC CAPABILITY

CROSS-REFERENCE TO RELATED APPLICATIONS

This application claims priority from Japanese Patent Application 2007-227000, filed Aug. 31, 2007, the entire contents of which are incorporated herein by reference.

BACKGROUND OF THE INVENTION

1. Technical Field

The present invention relates to a semiconductor integrated circuit and more particularly to a semiconductor integrated circuit for carrying out a failure diagnosing operation by using a built-in self test circuit of a memory.

2. Description of the Related Art

In a semiconductor integrated circuit including a memory, there has been used a technique for incorporating a built-in self test (which will be hereinafter referred to as a BIST), carrying out the BIST by using the BIST circuit to detect a defective chip, and subsequently performing a failure diagnosis over the defective chip by using the BIST circuit, thereby extracting a candidate for a defective portion of the memory. Examples of the BIST circuit include a comparator type BIST circuit for comparing an expected value which is identical to write data with data read from the memory and deciding the presence of a failure and a compressor type BIST circuit for compressing the data read from the memory in the BIST circuit and deciding the presence of the failure by using a result of the compression (for example, see JP-A-2005-129174 Publication (Page 11, FIG. 4)).

In the BIST circuit described in the JP-A-2005-129174, it is possible to read a status in a memory by repeating an interruption of a BIST operation, a shift-out and a restart of the BIST operation. Based on the result, it is possible to create a bit failure map indicative of a failure bit position in a cell array of the memory, thereby executing a failure analysis.

Irrespective of the presence of the failure, it is necessary to read all internal statuses and to also shift a register of the memory which is not a failure diagnosing target. For this reason, there is a matter in that a time required for the test is prolonged enormously. Moreover, there is a matter in that a size of a test pattern for carrying out a failure diagnosis through the BIST is increased greatly. In addition, there is a matter in that it is hard to acquire failure diagnosis information which is equivalent to a result of an actual speed test.

SUMMARY OF THE INVENTION

According to an aspect of the present invention, there is provided a semiconductor integrated circuit including: a memory collars including: a memory cell; a fetch register that is configured to fetch data written in the memory as a first fetch data; a comparing unit that is configured to compare the first fetch data with an expected value expected to be written in the memory; a failure detecting signal output unit that is configured to receive the compared result output from the comparing unit and output a failure detecting signal; and a built-in self test (to be referred to as a BIST hereinafter) circuit including: a BIST control unit that is configured to output an instruction to a memory collar to write a given data to a given address of a memory cell and output a BIST status signal indicating a status of the BIST; a shift controller that is configured to receive a first clock signal, the BIST status signal, and the failure detecting signal and output shift enable signal to the fetch register to draw out the failure information stored in the fetch register when the failure detecting signal is given; a shift counter that counts the number of clock pulses on the first clock signal and outputs the counted number to the shift controller; a first storage register that is configured to receive the first clock signal, the failure information serially transferred from the fetch register, and the shift enable signal and store the failure information in synchronization with the first clock signal, and a second storage register that is configured to receive a second clock signal having a lower frequency than the first clock signal, and the failure information stored in the first storage register and serially output the received failure information to an outside of the semiconductor integrated circuit, the failure information being received in parallel in synchronization with the second clock signal.

DETAILED DESCRIPTION OF EXEMPLARY EMBODIMENTS OF THE INVENTION

Embodiments according to the invention will be described below with reference to the drawings.

First Embodiment

Figure 1:
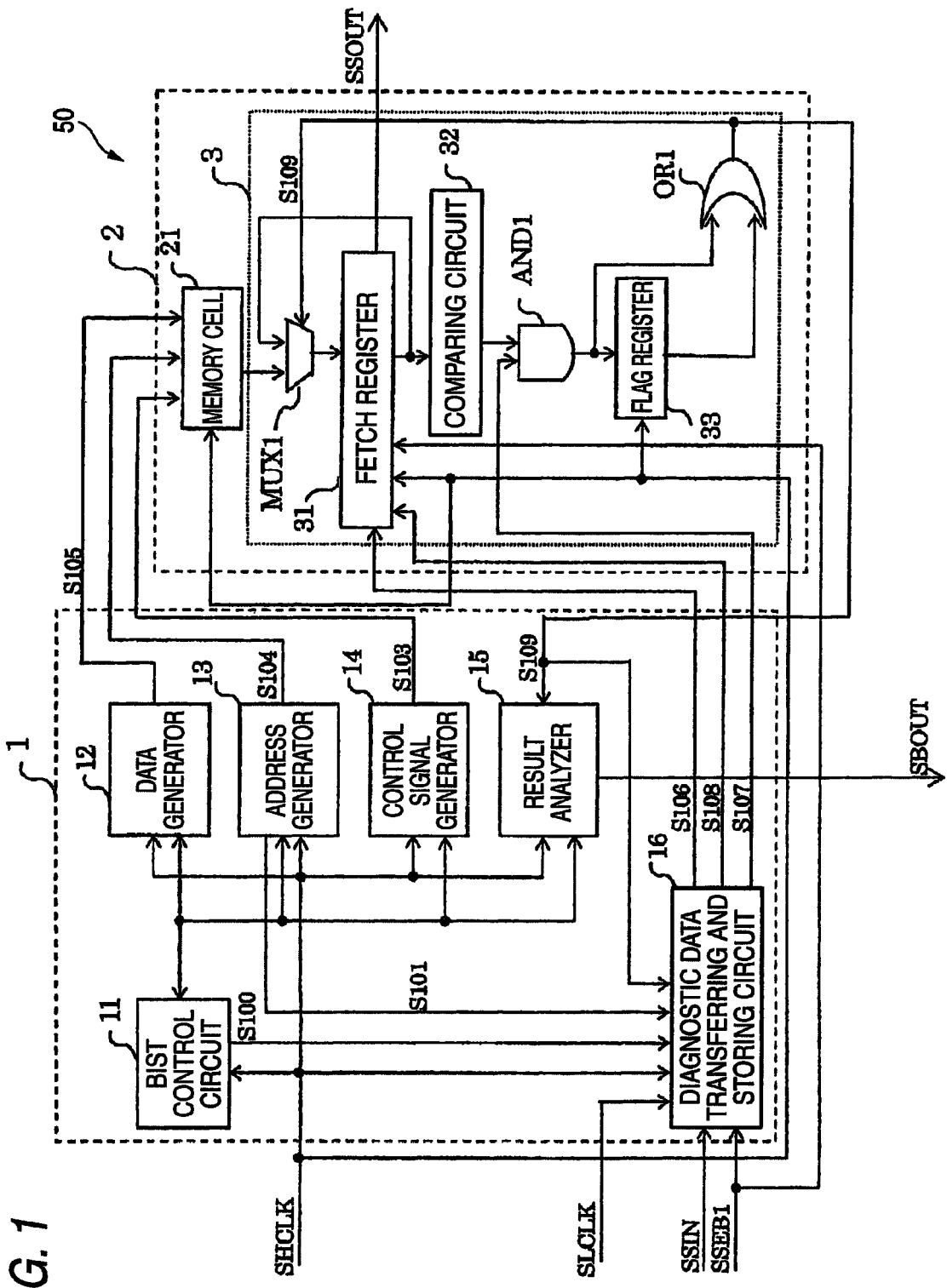
FIG. 1 is a block diagram showing a structure of a semiconductor integrated circuit according to a first exemplary embodiment.
Figure 2:
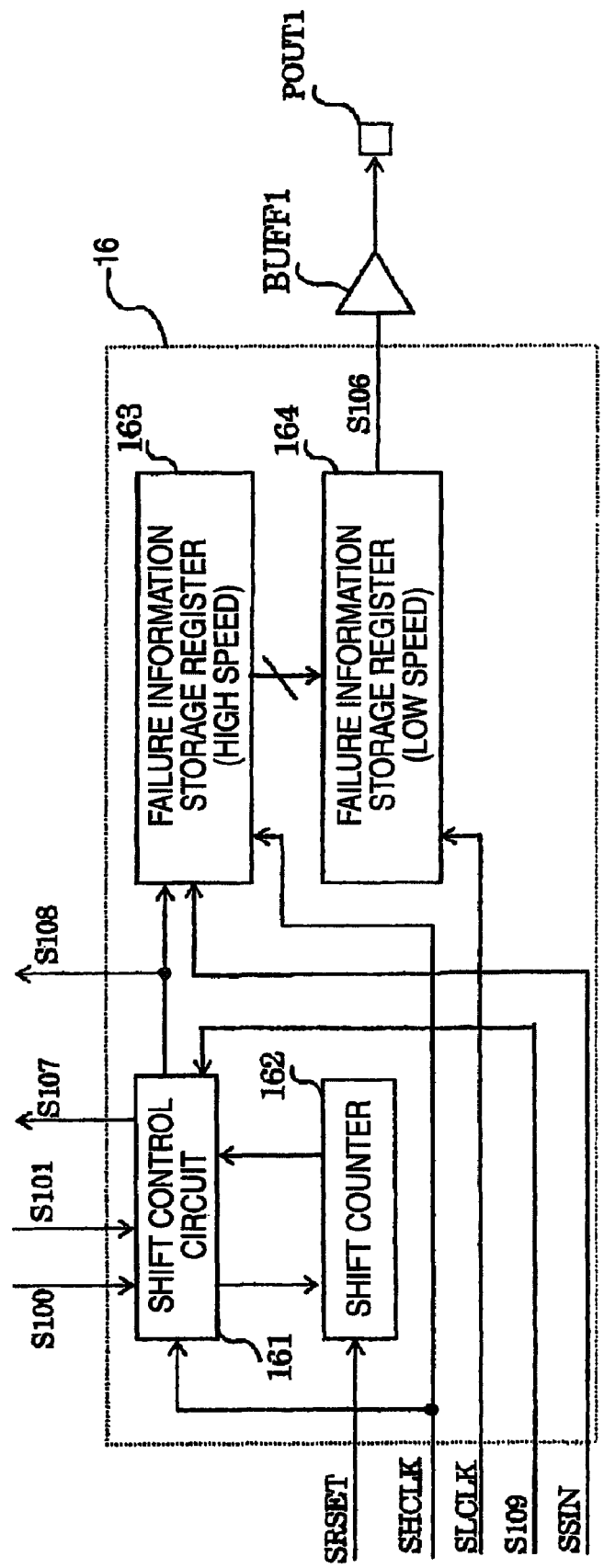
FIG. 2 is a block diagram showing a structure of a diagnostic data transferring and storing circuit according to the first exemplary embodiment.

First of all, a semiconductor integrated circuit according to a first embodiment of the invention will be described with reference to the drawings. FIG. 1 is a block diagram showing a structure of the semiconductor integrated circuit and FIG. 2 is a block diagram showing a structure of a diagnostic data transferring and storing circuit. In the embodiment, the diagnostic data transferring and storing circuit is provided in a BIST circuit.

As shown in FIG. 1, a semiconductor integrated circuit 50 is provided with a BIST circuit 1 and a memory collar 2. The semiconductor integrated circuit 50 is a system LSI comprising an SRAM (Static Random Access Memory) to be a semiconductor memory, a combinational circuit and a sequential circuit, for example. The memory collar is also referred to as a memory wrapper.

The BIST circuit 1 is provided with a BIST control circuit 11, a data generator 12, an address generator 13, a control signal generator 14, a result analyzer 15, and a diagnostic data transferring and storing circuit 16. The BIST circuit 1 is of a comparator BIST type which compares an identical expected value to write data with data read from a memory to decide a failure.

The BIST control circuit 11 inputs a high speed clock signal SHCLK which has a higher speed than a low speed clock signal SLCLK, and sequentially generates signals for controlling operations of the data generator 12, the address generator 13, the control signal generator 14 and the result analyzer 15 and outputs the signals thereto. The BIST control circuit 11 inputs signals output from the data generator 12, the address generator 13, the control signal generator 14 and the result analyzer 15 and outputs a BIST status signal S100 indicative of a status of a BIST to the diagnostic data transferring and storing circuit 16.

The data generator 12 inputs the high speed clock signal SHCLK and a control signal output from the BIST control circuit 11 and generates a write data signal S105 to be sent to a memory cell 21.

The address generator 13 inputs the high speed clock signal SHCLK and the control signal output from the BIST control circuit 11 and generates an address signal S101 and an address data signal S104 to be sent to the memory cell 21.

The control signal generator 14 inputs the high speed clock signal SHCLK and the control signal output from the BIST control circuit 11 and generates a memory control signal S103.

The result analyzer 15 inputs the high speed clock signal SHCLK, the control signal output from the BIST control circuit 11 and a failure detecting signal S109 output from the memory collar 2, and decides quality of the whole BIST and outputs a final BIST result signal SBOUT to an external testing device.

The diagnostic data transferring and storing circuit 16 inputs the high speed clock signal SHCLK, the low speed clock signal SLCLK, a shift input signal SSIN, a shift enable signal SSEB1, the BIST status signal S100, the address signal S101 and the failure detecting signal S109 and outputs a serial output signal S106, a control signal S107 and a shift enable signal S108. A structure and operation of the diagnostic data transferring and storing circuit 16 will be described below.

The memory collar 2 is provided with a memory output result analyzing circuit 3 and the memory cell 21. The memory output result analyzing circuit 3 is provided with a fetch register 31, a comparing circuit 32, a flag register 33, a multiplexer MUX1, a 2-input AND circuit AND1, and a 2-input OR circuit OR1.

The memory cell 21 inputs the high speed clock signal SHCLK, the memory control signal S103, the address data signal S104 and the write data signal S105, and writes data. The data read from the memory cell 21 are output to the multiplexer MUX1.

The multiplexer MUX1 inputs the data read from the memory cell 21 and data output from the fetch register 31, and switches an output based on the failure detecting signal S109 which implies a detection of a failure. The failure detecting signal S109 has a logic "0" before the failure is detected, and an output from the memory cell 21 is exactly output from the multiplexer MUX1. When the failure is once detected so that the failure detecting signal S109 having the logic "1" is sent to the multiplexer MUX1, an output of the fetch register 31 is selected and sent. Consequently, the fetch register 31 maintains the same output.

The fetch register 31 inputs the high speed clock signal SHCLK, the shift enable signal SSEB1, the serial output signal S106 and the shift enable signal S108 and outputs a signal to the comparing circuit 32. More specifically, the fetch register 31 usually fetches data output from the multiplexer MUX1 and outputs the information to the comparing circuit 32 based on the high speed clock signal SHCLK (in the case in which the shift enable signal S108 is not given to the diagnostic data transferring and storing circuit 16). After the BIST is ended, when the shift enable signal S108 is sent to the diagnostic data transferring and storing circuit 16, the stored data are serially output as a serial output signal SSOUT to an outside.

The comparing circuit 32 inputs a signal output from the fetch register 31 and sends an output signal to the 2-input AND circuit AND1. The comparing circuit 32 compares the data output from the fetch register 31 with an identical data expected value to the write data signal S105 generated from the data generator 12. A comparison result signal having a logic "0" is output while the data are coincident with each other, and a comparison result signal having a logic "1" is output when they are not coincident with each other, that is, a failure is detected.

The 2-input AND circuit (first logical operation means) AND1 inputs the control signal S107 and a signal output from the comparing circuit 32 and outputs a signal subjected to a logical operation. At the start of the BIST, the failure is not detected. Therefore, the control signal S107 having the logic "1" is output from the diagnostic data transferring and storing circuit 16 to the 2-input AND circuit AND1 and the comparison result signal of the comparing circuit 32 is exactly output from the 2-input AND circuit AND1.

However, the control signal S107 having the logic "0" is output from the diagnostic data transferring and storing circuit 16 before the failure is once detected and the BIST is restarted at a more previous time so that the failure portion is reached, and the same control signal S107 is input to the 2-input AND circuit AND1 before the failure portion is reached. Consequently, the comparison result signal of the comparing circuit 32 is not output from the 2-input AND circuit AND1 but data having the logic "0" are output continuously.

The flag register 33 inputs the high speed clock signal SHCLK and a signal output from the 2-input AND circuit AND1 and outputs a signal to the 2-input OR circuit OR1. The flag register 33 continuously fetches the output of the fetch register 31 while the failure detecting signal S109 has the logic "0" and is invalid, and maintains a status while storing current data after one cycle when the failure detecting signal S109 has the logic "1".

The 2-input OR circuit (second logic operation means) OR1 inputs the signal output from the 2-input AND circuit AND1 and a signal output from the flag register 33 and outputs, as the failure detecting signal S109, a signal subjected to the logical operation.

In an execution of the BIST, the BIST operation is completed in a state in which a defect detected at a time of a defect detection is stored in the fetch register 31. When the failure detecting signal S109 is input to the diagnostic data transferring and storing circuit 16, the diagnostic data transferring and storing circuit 16 starts an operation. When the shift enable signal S108 is output from the diagnostic data transferring and storing circuit 16, the data stored in the fetch register 31 are automatically transferred to the diagnostic data transferring and storing circuit 16. Moreover, the failure detecting signal S109 output from the 2-input OR circuit OR1 is input to the result analyzer 15 of the BIST circuit 1.

As shown in FIG. 2, the diagnostic data transferring and storing circuit 16 is provided with a shift control circuit 161, a shift counter 162, a failure information storage register (high-speed) 163, and a failure information storage register (low speed) 164.

The shift control circuit 161 inputs the high speed clock signal SHCLK, the BIST status signal S100, the address signal S101 and the failure detecting signal S109 and outputs the control signal S107 and the shift enable signal S108. More specifically, when the failure detecting signal S109 has the logic "1", the shift control circuit 161 decides the failure detection and transfers, to the failure information storage register (high speed) 163, the defective data stored in the fetch register 31 of the memory collar 2. The shift control circuit 161 counts the number of clocks required for transferring the defective data of the memory cell 21 to the failure information storage register (high speed) 163 and enables (activates) the shift enable signal S108.

The shift counter 162 inputs a signal output from the shift control circuit 161 and brings the shift enable signal S108 into an enable (active) state to count the number of clocks required for transferring the defective data to the failure information storage register (high speed) 163, and outputs the information to the shift control circuit 161. The shift counter 162 is properly reset in response to a reset signal SRSET.

The failure information storage register (high speed) 163 inputs the high speed clock signal SHCLK, the shift input signal SSIN and the shift enable signal S108 and stores the defective data stored in the fetch register 31 of the memory collar 2 and transferred serially based on the high speed clock signal SHCLK.

The failure information storage register (low speed) 164 stores the defective data stored in the fetch register 31 of the memory collar 2, transferred in parallel and output from the failure information storage register (high speed) 163 based on the low speed clock signal SLCLK, and transfers and outputs the failure information as the serial output signal S106 to an outside of the semiconductor integrating circuit 50 through a buffer BUFF1 and an output terminal POUT1.

When the transfer to the outside is completed, the BIST is restarted. After the restart of the BIST, the control signal S107 is set to have the logic "0" until a failure status detected at a last time is brought, and failure information is prevented from being acquired. The control signal S107 is cancelled immediately after the failure status detected at the last time is brought, and next failure information can be thus acquired.

By the serial repeating work, all of the failure information can be acquired. Also in the case in which the failure information are read to an external testing device, for example, it is not necessary to switch the high speed clock signal SHCLK and the low speed clock signal SLCLK and it is possible to completely transfer the failure information to the external testing device by using the low speed clock signal SLCLK in a state in which the internal high speed clock signal SHCLK is operated.

In the result analyzer 15, the quality of the whole BIST is decided, and furthermore, the final BIST result signal SBOUT is output to the external testing device. The failure detecting signal S109 output from the 2-input OR circuit OR1 is also input to the diagnostic data transferring and storing circuit 16. When the failure is once detected and the failure detecting signal S109 is generated, information about the failure generation is sent to the diagnostic data transferring and storing circuit 16. Thus, the BIST operation using the BIST circuit is carried out so that the decision of the quality for the memory cell 21 is carried out.

Figure 3:
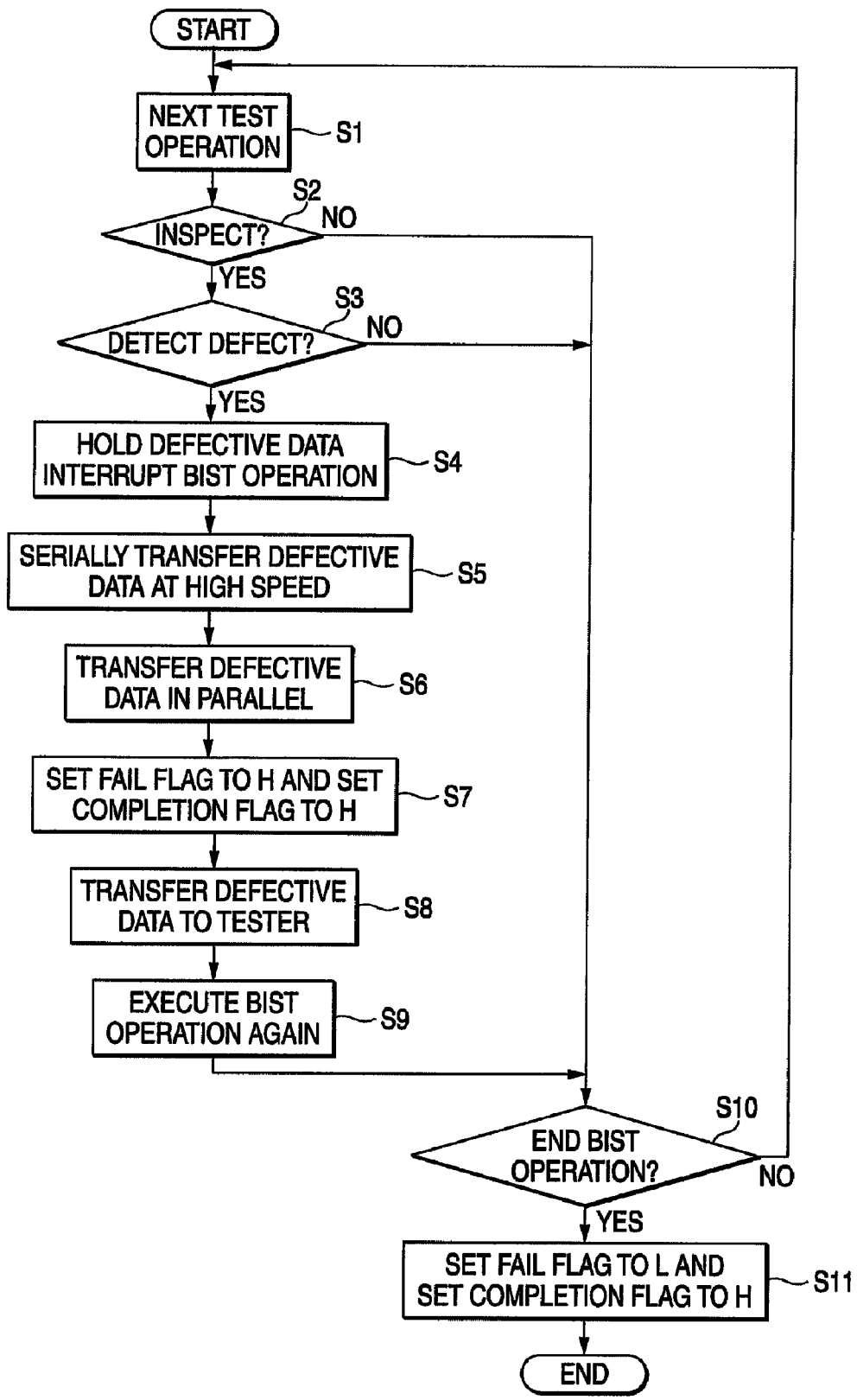
FIG. 3 is a flowchart showing a procedure for a failure diagnosing operation of a memory according to the first exemplary embodiment.

Next, the failure diagnosis of the memory will be described with reference to FIG. 3. FIG. 3 is a flowchart showing a procedure for the failure diagnosing operation of the memory.

As shown in FIG. 3, in the failure diagnosing operation of the memory, the BIST control circuit 11 first starts an execution of a next test operation for the BIST (Step S1).

Next, it is decided whether the last BIST interruption has not been carried out (Step S2). If the last interruption has not been carried out, it is decided whether the BIST operation reaches an ending stage or not (Step S10). If the BIST operation does not reach the ending stage, the processing returns to the next test operation (Step S1). If the BIST operation reaches the ending stage, a fail flag is set to have a "Low" level (logic "0") and a completion flag is set to have a "High" level (logic "1") (Step S11).

If the last BIST interruption has been carried out, it is decided whether a defect is detected or not (Step S3). If the defect is not detected, the processing proceeds to the BIST operation end (Step S10). If the defect is detected, the processing proceeds to a next step.

When a failure is detected in progress of the test, then, a defective data pattern is stored and the BIST operation is interrupted (Step S4). Thereafter, a high speed serial transfer of defective data is automatically executed in response to a control signal output from the diagnostic data transferring and storing circuit 16 after the interruption (Step S5).

When the high speed serial transfer of the defective data (a transfer to the failure information storage register (high speed) 163) is completed, subsequently, the data subjected to the high speed serial transfer are transferred in parallel to the failure information storage register (low speed) 164 to be operated in response to a low speed clock signal and the information is stored in the failure information storage register (low speed) 164 (Step S6).

Then, the fail flag is set to have the "High" level (logic "1") and the completion flag is set to have the "High" level (logic "1") (S7). Next, the defective data are transferred to an external testing device (Step S8).

Subsequently, the BIST operation is executed again (Step S9). The operation is repetitively executed until the BIST operation is completely ended.

As described above, the semiconductor integrated circuit according to the embodiment is provided with the BIST circuit 1 and the memory collar 2. The BIST circuit 1 is provided with the BIST control circuit 11, the data generator 12, the address generator 13, the control signal generator 14, the result analyzer 15, and the diagnostic data transferring and storing circuit 16. The memory collar 2 is provided with the memory output result analyzing circuit 3 and the memory cell 21. The memory output result analyzing circuit 3 is provided with the fetch register 31, the comparing circuit 32, the flag register 33, the multiplexer MUX1, the 2-input AND circuit AND1, and the 2-input OR circuit OR1. The diagnostic data transferring and storing circuit 16 is provided with the shift control circuit 161, the shift counter 162, the failure information storage register (high speed) 163 and the failure information storage register (low speed) 164. When the failure detecting signal S109 output from the 2-input OR circuit OR1 of the memory output result analyzing circuit 3 is input to the diagnostic data transferring and storing circuit 16 of the BIST circuit 1, the diagnostic data transferring and storing circuit 16 starts an operation. When the shift enable signal S108 is output from the diagnostic data transferring and storing circuit 16, the data stored in the fetch register 31 are automatically transferred to the diagnostic data transferring and storing circuit 16. The failure detecting signal S109 output from the 2-input OR circuit OR1 is input to the result analyzer 15 of the BIST circuit 1. In the execution of the BIST, the BIST operation is completed in a state in which the defect detected at a time of the defect detection is stored in the fetch register 31. When the transfer of the failure information to the outside is completed, the BIST is restarted. After the BIST is restarted, the control signal S107 output from the diagnostic data transferring and storing circuit 16 is set to have the logic "0" until the failure status detected at the last time is brought, and the failure information is not acquired. Immediately after the failure status detected at the last time is brought, the control signal S107 is cancelled so that next failure information can be acquired.

Therefore, in the case in which the failure information of the memory is transferred to an external testing device, for example, it is not necessary to switch the high speed clock signal SHCLK and the low speed clock signal SLCLK and it is possible to complete the transfer of the failure information to the external testing device by using the low speed clock signal SLCLK in a state in which the high speed clock signal SHCLK is operated. Accordingly, it is possible to shorten a time required for the test. Moreover, it is possible to reduce a size of a test pattern for carrying out the failure diagnosis in the BIST. It is possible to acquire failure diagnosis information which is equivalent to the result of the actual speed test.

While the invention is applied to the BIST of the SRAM to be a memory in the embodiment, it can be applied to a semiconductor memory such as a DRAM, a flash ROM or a mask ROM.

Second Embodiment

Figure 4:
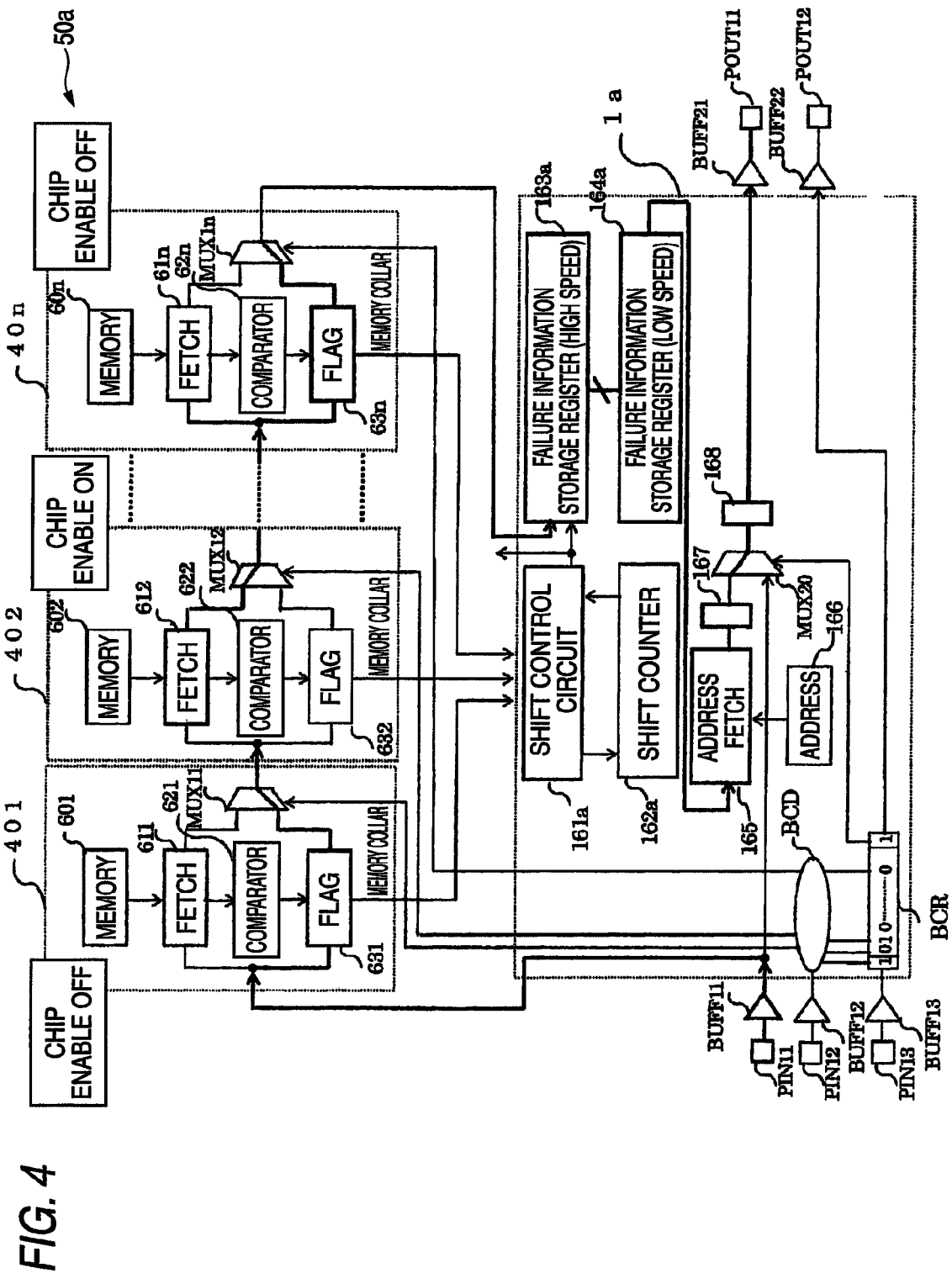
FIG. 4 is a block diagram showing a flow of a signal in the case in which a failure diagnosis of a memory is carried out according to a second exemplary embodiment
Figure 5:
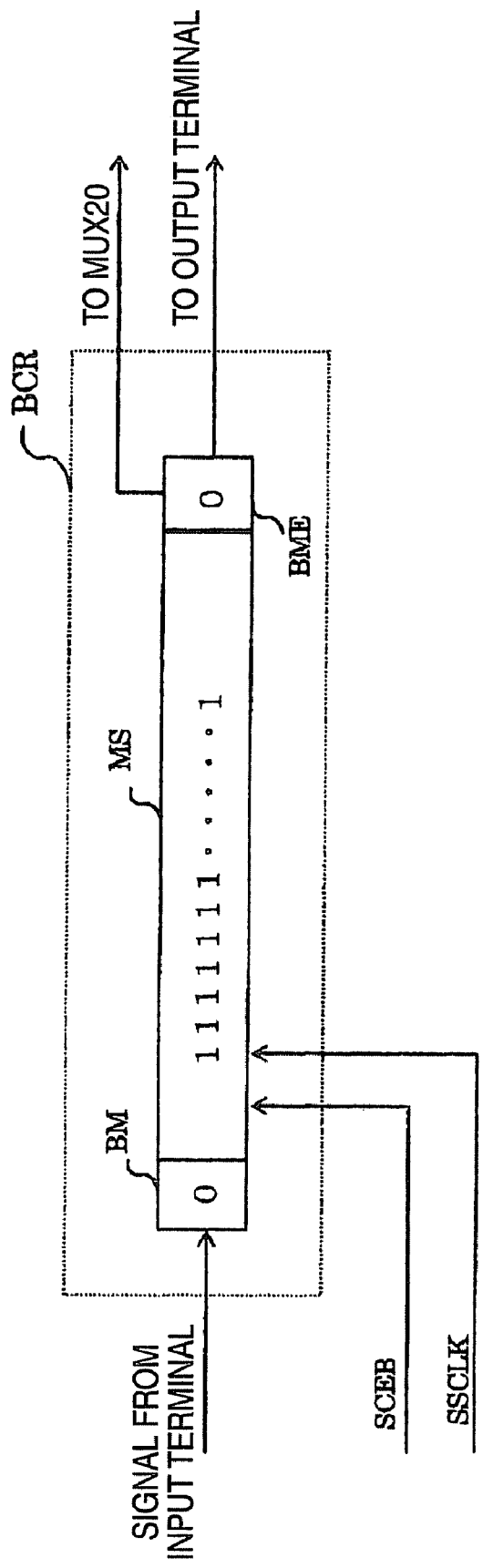
FIG. 5 is a diagram showing a structure of a BIST operation setting register according to the second exemplary embodiment.

Next, a semiconductor integrated circuit according to a second embodiment of the invention will be described with reference to the drawings. FIG. 4 is a block diagram showing a flow of a signal in the case in which a failure diagnosis for a memory is carried out, and FIG. 5 is a diagram showing a structure of a BIST operation setting register. In the embodiment, a memory other than a failure diagnosing target memory is bypassed to shorten a time required for a data transfer.

As shown in FIG. 4, a semiconductor integrated circuit 50a is provided with a BIST circuit 1a, a memory collar 401, a memory collar 402, a memory collar 40n, input buffers BUFF11 to BUFF13, an output buffer BUFF21, an output buffer BUFF22, input terminals PIN11 to PIN13, an output terminal POUT11 and an output terminal POUT12. The semiconductor integrated circuit 50a is an SoC (System on a Chip) including an SRAM to be a semiconductor memory, a logic circuit, a sequential circuit and an analog circuit, for example.

The semiconductor integrated circuit 50a is provided with n memory collars (the same structure) in n stages. The memory collar 401 is provided with a memory 601, a fetch register 611, a comparator 621, a flag register 631 and a multiplexer MUX11. The memory collar 402 is provided with a memory 602, a fetch register 612, a comparator 622, a flag register 632 and a multiplexer MUX12. The memory collar 40n is provided with a memory 60n, a fetch register 61n, a comparator 62n, a flag register 63n and a multiplexer MUX1n. The multiplexers MUX11 to MUX1n function as first selecting means for selecting and outputting either a signal output from the fetch register 611 or a signal output from the flag register 631.

In the embodiment, for example, the memory collar 402 is selected as a failure diagnosing target and the memory collars other than the memory collar 402 are set to be non-failure diagnosing targets and are not selected to prevent an unnecessary power from being generated.

The BIST circuit 1a is provided with a shift control circuit 161a, a shift counter 162a, a failure information storage register (high speed) 163a, a failure information storage register (low speed) 164a, an address fetch register 165, an address register 166, an end flag register 167, a decision flag register 168, a BIST setting decoder BCD (BIST Configuration Decoder), a BIST operation setting register BCR (BIST Configuration Register) and a multiplexer MUX20.

The shift control circuit 161a, the shift counter 162a, the failure information storage register (high speed) 163a and the failure information storage register (low speed) 164a carry out the same operations as the shift control circuit 161, the shift counter 162, the failure information storage register (high speed) 163 and the failure information storage register (low speed) 164 according to the first embodiment (shown in FIG. 2), respectively.

The address fetch register 165 inputs a signal output from the failure information storage register (low speed) 164a and a signal output from the address register 166, and fetches an address of failure information.

The end flag register 167 inputs a signal output from the address fetch register 165 and sends an output signal to the multiplexer MUX20. The multiplexer MUX20 inputs the signal output from the end flag register 167 and a signal output from the outside through the input terminal PIN11 and the input buffer BUFF11, and selects and outputs either of them in response to a signal output from the BIST operation setting register BCR. The decision flag register 168 inputs a signal output from the multiplexer MUX20 and outputs a signal to the output buffer BUFF21. The multiplexer MUX20 functions as second selecting means for selecting and outputting either the signal output from the end flag register 167 or the signal output from the outside through the input terminal PIN11.

As shown in FIG. 5, the BIST operation setting register BCR includes an operating mode setting bit BM, a memory selecting bit string MS and a BIST operation enable bit BME. The BIST operation setting register BCR has a shift register structure in which a signal output from the outside through the input terminal PIN13 and the input buffer BUFF13 is input and data are sequentially shift transferred from an input terminal side to an output terminal side.

The operating mode setting bit BM serves to switch the BIST operation and the failure diagnosing operation, and a corresponding memory serves as a BIST target when the bit has the logic "0" and serves as a failure diagnosing target when the bit has the logic "1". Herein, it is indicated that the operating mode setting bit BM has the logic "0" and serves as the BIST target.

The memory selecting bit string MS are data for setting the selection of the memory serving as the BIST target or the failure diagnosing target. Herein, each bit corresponding to any of the memories and the memory corresponding to the bit having the logic "1" serves as the BIST target or the failure diagnosing target. Herein, it is indicated that all of the bits (n bits) have the logic "1" and all of n memories 601 to 60n serve as the BIST targets. Data output from the memory selecting bit string MS are input to the multiplexer of the memory collar through the BIST setting decoder BCD, respectively. Based on the information, any of the signal output from the fetch register and the signal output from the flag register is selected by the multiplexer. The BIST setting decoder BCD inputs a signal sent from the outside through the input terminal PIN12 and the input buffer BUFF12.

The BIST operation enable bit BME are data for setting whether the BIST circuit is the BIST target or the failure diagnosing target at the present time. It is indicated that the BIST circuit is not the target when the bit has the logic "0", and is the target when the bit has the logic "1".

When the BIST operation enable bit BME is set to be "1", the signal output from the end flag register 167 is selected through switch setting of the multiplexer MUX20 in the BIST circuit 1a. When the BIST operation enable bit BME is set to be "0", the signal input from the outside through the input terminal PIN11 and the input buffer BUFF11 is selected.

It is premised that the failure diagnosis is usually carried out by setting, as a target, a memory included in one of the memory collars 401 to 40n connected to the BIST circuit 1a in order to easily perform a failure analysis. Therefore, only one bit corresponding to the memory serving as the failure diagnosing target in the memory selecting bit string MS in the BIST operation setting register BCR is set to have the logic "1".

As shown in FIG. 4, it is assumed that the memory 602 included in the memory collar 402 to be a second one from a left in the memory selecting bit string MS is set to be a target and the memories included in the other memory collars are set to be non-targets. In the BIST operation setting register BCR of the BIST circuit 1a, therefore, the bit string is set in such a manner that only a second bit from an input terminal side in the memory selecting bit string MS has the logic "1".

As shown in a thick line of FIG. 4, consequently, there are serially connected the input terminal PIN11, the input buffer BUFF11, the flag register 631 of the non-selecting memory collar 401, the multiplexer MUX11 of the non-selecting memory collar 401, the fetch register 612 of the selecting memory collar 402, the multiplexer MUX12 of the selecting memory collar 402, . . . , the flag register 63n of the non-selecting memory collar 40n, the multiplexer MUX1n of the non-selecting memory collar 40n and the failure information storage register (high speed) 163a of the BIST circuit 1a, the failure information storage register (high speed) 163a of the BIST circuit 1a and the failure information storage register (low speed) 164a of the BIST circuit 1a are connected in parallel with each other, and there are serially connected the failure information storage register (low speed) 164a of the BIST circuit 1a, the address fetch register 165 of the BIST circuit 1a, the end flag register 167 of the BIST circuit 1a, the multiplexer MUX20 of the BIST circuit 1a, the decision flag register 168 of the BIST circuit 1a, the output buffer BUFF21, and the output terminal POUT11.

In this case, in the execution of the failure diagnosis, a chip enable input is brought into an "ON" state in only the memory (the memory 602) in which the memory selecting bit is set to have the logic "1", and the multiplexer MUX11 of the non-selecting memory collar 401 selects a serial output of the fetch register 612 of the selecting memory collar 402. For this reason, an unnecessary power is not consumed during the execution of the failure diagnosis. It is also possible to set the memories as the failure diagnosing targets at the same time.

In the failure diagnosing operation, a memory reading operation is carried out. Every time a failure is detected, the BIST operation is interrupted to shift operate the fetch register, thereby observing the memory output through the output terminal POUT11. At this time, a 1-bit shift is carried out in the memories to be tested through the same BIST circuit other than the memory serving as the failure diagnosing target. In the other BIST circuits which are not shown, moreover, a 1-bit shift pass is carried out as a whole. Therefore, a step required for the shift is shortened so that it is possible to considerably shorten an executing time of a memory tester which is required for the failure diagnosis. The data of the memories other than the test target are not shifted. As compared with the case in which all of the memory data are output, therefore, it is possible to shorten the time required for the test.

As described above, the semiconductor integrated circuit according to the embodiment is provided with the BIST circuit 1a, the memory collar 401, the memory collar 402, the memory collar 40n, the input buffers BUFF11 to BUFF13, the output buffer BUFF21, the output buffer BUFF22, the input terminals PIN11 to PIN13, the output terminal POUT11, and the output terminal POUT12. The memory collar 401 is provided with the memory 601, the fetch register 611, the comparator 621, the flag register 631 and the multiplexer MUX11, the memory collar 402 is provided with the memory 602, the fetch register 612, the comparator 622, the flag register 632 and the multiplexer MUX12, the memory collar 40n is provided with the memory 60n, the fetch register 61n, the comparator 62n, the flag register 63n and the multiplexer MUX1n. The BIST circuit 1a is provided with the shift control circuit 161a, the shift counter 162a, the failure information storage register (high speed) 163a, the failure information storage register (low speed) 164a, the address fetch register 165, the address register 166, the end flag register 167, the decision flag register 168, the BIST setting decoder BCD, the BIST operation setting register BCR and the multiplexer MUX20. In the failure diagnosis, it is assumed that the memory 602 included in the memory collar 402 to be a second one from the left in the memory selecting bit string MS is set to be a target and the memories included in the other memory collars are set to be non-targets. In the BIST operation setting register BCR of the BIST circuit 1a, the bit string MS is set in such a manner that only a second bit from the input terminal side in the memory selecting bit string MS has the logic "1". As a result, there are connected the input terminal PIN11, the input buffer BUFF11, the flag register 631 of the non-selecting memory collar 401, the multiplexer MUX11 of the non-selecting memory collar 401, the fetch register 612 of the selecting memory collar 402, the multiplexer MUX12 of the selecting memory collar 402, . . . , the flag register 63n of the non-selecting memory collar 40n, the multiplexer MUX1n of the non-selecting memory collar 40n, the failure information storage register (high speed) 163a of the BIST circuit 1a, the failure information storage register (low speed) 164a of the BIST circuit 1a, the address fetch register 165 of the BIST circuit 1a, the end flag register 167 of the BIST circuit 1a, the multiplexer MUX20 of the BIST circuit 1a, the decision flag register 168 of the BIST circuit 1a, the output buffer BUFF21, and the output terminal POUT11.

During the execution of the failure diagnosis, therefore, the chip enable of the memory which is not selected is turned OFF. Therefore, an unnecessary power is not consumed. In the other BIST circuits, moreover, the step required for the shift is shortened so that it is possible to considerably shorten the executing time of the memory tester which is required for the failure diagnosis. The data of the memories other than the test target are not shifted. As compared with the case in which data of all of the memories are output, therefore, it is possible to shorten a time required for a test.

The invention is not restricted to the embodiments but various changes may be made without departing from the scope of the invention.

As described with reference to the embodiment, there is provided a semiconductor integrated circuit capable of holding failure information while maintaining a high speed BIST operation, thereby executing a failure diagnosis easily.

According to the above embodiments, it is possible to provide a semiconductor integrated circuit capable of holding failure information while maintaining a high speed BIST operation, thereby executing a failure diagnosis easily.

What is claimed is:

1. A semiconductor integrated circuit comprising:
   a built-in self test (to be referred to as a BIST hereinafter) circuit including:
   a data generator that is configured to generate write data to be written in a memory cell and output the write data to the memory cell;

an address generator that is configured to generate an address data including address to be assigned to the memory cell and output the address data to the memory cell;
a memory control signal generator that is configured to generate a memory control signal for controlling the memory cell and output the memory control signal to the memory cell;
a result analyzer that is configured to receive a failure detecting signal indicating a failure of the memory cell and analyze a result of the BIST to output the analyzed result of the BIST;
a diagnostic data transferring unit that is configured to:
receive the failure detecting signal, a first clock signal, and a second clock signal having a lower frequency than the first clock signal;
output a shift enable signal in response to receiving the failure detecting signal,
store failure information of the memory cell in synchronization with the first clock signal;
transfer the failure information in synchronization with the second clock signal in response to receiving the failure detecting signal; and
a BIST control unit that is configured to control the data generator, the address generator, the memory control signal generator and the result analyzer and output a BIST status signal indicating a status of the BIST to the diagnostic data transferring unit; and
a memory collar including:
the memory cell that is configured to receive the first clock signal, the write data, the address data signal, and the memory control signal, and write the write data;
a fetch register that is configured to fetch data written in the memory cell when the shift enable signal is not given and transfer fetched data to the diagnostic data transferring unit when the shift enable signal is given;
a comparing unit that is configured to compare the data fetched in the fetch register with an expected value output from the BIST circuit;
a first logical unit that is configured to:
receive the compared result output from the comparing unit and a control signal output from the diagnostic data transferring unit;
perform a first logical operation on the compared result and the control signal; and
output a result of the first logical operation;
a flag register that is configured to fetch the output of the first logical unit when the output of the first logical unit indicate that the failure of the memory cell is not happened and output the fetched data; and
a second logical unit that is configured to:
receive the output of the first logical unit and the output of the flag register;
perform a second logical operation on the output of the first logical unit and the output of the flag register; and
output a result of a second logical operation as the failure detecting signal.

2. The semiconductor integrated circuit according to claim 1, wherein the diagnostic data transferring unit further includes:
a shift controller that is configured to receive the first clock signal, the BIST status signal, the address data, and the failure detecting signal (S109) and output shift enable signal (S108) to draw out the failure information stored in the fetch register when the failure detecting signal is given;
a shift counter that counts the number of clock pulses on the first clock signal and outputs the counted number to the shift controller;
a first storage register that is configured to receive the first clock signal, the failure information serially transferred from the fetch register, and the shift enable signal and store the failure information in synchronization with the first clock signal; and
a second storage register that is configured to receive the second clock signal and the failure information stored in the first storage register and serially output the received failure information to an outside of the semiconductor integrated circuit, the failure information being received through a parallel path connected between the first storage register and the second storage register in synchronization with the second clock signal.

3. The semiconductor integrated circuit according to claim 2, wherein, after the BIST is restarted, the shift controller is configured to output the control signal to set the failure information to be unacquirable until the BIST is performed on a failure position on which a failure status was previously detected,
wherein the shift controller is configured to output the control signal to set the failure information to be acquirable after the BIST is performed on the failure position, and
wherein the BIST is restarted after complete the transfer of the failure information.

4. The semiconductor integrated circuit according to claim 3, wherein the first logical unit is a 2-input AND circuit and the second logical unit is a 2-input OR circuit.

5. The semiconductor integrated circuit according to claim 3, wherein the shift controller sets the failure information to be unacquireble by outputting logical zero to the first logical unit, and
wherein the shift controller sets the failure information to be acquirable by outputting logical one to the first logical unit.

6. The semiconductor integrated circuit according to claim 1, wherein the memory cell includes SRAM, DRAM, Flash ROM, and Mask ROM.

7. The semiconductor integrated circuit according to claim 1, wherein the shift controller calculate the number of clock pulses of the first clock signal needed to draw out all data stored in the fetch register.

8. A semiconductor integrated circuit comprising:
a plurality of memory collars each including:
a memory;
a fetch register that is configured to fetch data written in the memory as a first fetch data;
a comparing unit that is configured to compare the first fetch data with an expected value expected to be written in the memory;
a flag register that is configured to fetch the compared result output from the comparing unit as a second fetch data; and
a first selector that is configured to receive and selectively output the first fetched data and the second fetch data as a memory collar output;
wherein the memory collars are serially connected so that the memory collar output is input to the fetch register or the flag register of the subsequent memory collar to form a sequential path, a built-in self test (to be referred to as a BIST hereinafter) circuit including:
  a first storage register that is configured to receive the memory collar output of a final stage of the memory collars;
  a second storage register that is configured to receive data stored in the first storage register in parallel;
  an address fetch register that is configured to receive data stored in the second storage register;
  a second selector that is configured to receive data stored in the address fetch register and data input from an outside through an input terminal and selectively output the received data; and
  a BIST setting register that sets an operation of a BIST;
  wherein, when one of the memory cells of the memory collars is selected as a target of failure diagnosing by the BIST operation setting register, a chip enable state of a target memory collar including the selected memory is set enable, so that the first selector serially outputs the fetched data stored in the fetch register to the subsequent memory collar or the first storage register in the selected memory collar.

9. The semiconductor integrated circuit according to claim 8, wherein the BIST setting resister is configured to determine that the second selector outputs the signal output from the address fetch register or the signal input from the outside.

10. The semiconductor integrated circuit according to claim 8, wherein the input terminal is configured to be connected to the fetch register and the flag register in an initial stage of the sequential path.

11. The semiconductor integrated circuit according to claim 8, wherein, a chip enable state of a non-target memory collar is set disable, so that the first selector serially outputs the fetched data in the flag register in the non-selected memory collar to the subsequent memory collar or the first storage register.

12. The semiconductor integrated circuit according to claim 8, wherein the memory cell includes SRAM, DRAM, Flash ROM, and Mask ROM.

13. A semiconductor integrated circuit comprising:
  a memory collars including:
    a memory cell;
    a fetch register that is configured to fetch data written in the memory as a first fetch data;
    a comparing unit that is configured to compare the first fetch data with an expected value expected to be written in the memory;
    a failure detecting signal output unit that is configured to receive the compared result output from the comparing unit and output a failure detecting signal; and
  a built-in self test (to be referred to as a BIST hereinafter) circuit including:
    a BIST control unit that is configured to output an instruction to the memory collar to write a given data to a given address of a memory cell and output a BIST status signal indicating a status of the BIST;
    a shift controller that is configured to receive a first clock signal, the BIST status signal, and the failure detecting signal and output shift enable signal to the fetch register to draw out the failure information stored in the fetch register when the failure detecting signal is given;
    a shift counter that counts the number of clock pulses on the first clock signal and outputs the counted number to the shift controller;
    a first storage register that is configured to receive the first clock signal, the failure information serially transferred from the fetch register, and the shift enable signal and store the failure information in synchronization with the first clock signal, and
    a second storage register that is configured to receive a second clock signal having a lower frequency than the first clock signal, and the failure information stored in the first storage register and serially output the received failure information to an outside of the semiconductor integrated circuit, the failure information being received in parallel in synchronization with the second clock signal.

14. The semiconductor integrated circuit according to claim 13, wherein the memory cell includes SRAM, DRAM, Flash ROM, and Mask ROM.

15. The semiconductor integrated circuit according to claim 13, wherein the shift controller calculate the number of clock pulses of the first clock signal needed to draw out all data stored in the fetch register.

* * * * *